(12) United States Patent
Lin

(10) Patent No.: US 11,348,548 B2
(45) Date of Patent: May 31, 2022

(54) DISPLAY DEVICE

(71) Applicant: InnoLux Corporation, Miao-Li County (TW)

(72) Inventor: Cheng-Yen Lin, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 17/089,806

(22) Filed: Nov. 5, 2020

(65) Prior Publication Data
US 2021/0056921 A1 Feb. 25, 2021

Related U.S. Application Data

(62) Division of application No. 15/974,876, filed on May 9, 2018, now abandoned.

(30) Foreign Application Priority Data

May 19, 2017 (CN) .......................... 201710357276.9

(51) Int. Cl.
*G09G 3/36* (2006.01)
*G02F 1/1362* (2006.01)
*H01L 27/12* (2006.01)

(52) U.S. Cl.
CPC ..... *G09G 3/3648* (2013.01); *G02F 1/136286* (2013.01); *G09G 3/3659* (2013.01);
(Continued)

(58) Field of Classification Search
CPC ... G09G 3/3648; G09G 3/3681; G09G 3/3692
See application file for complete search history.

(56) References Cited

U.S. PATENT DOCUMENTS

| 6,069,600 | A | * | 5/2000 | Saishu | ................. | G09G 3/3648 |
| | | | | | | 345/206 |
| 8,810,606 | B2 | * | 8/2014 | Kim | ..................... | G09G 3/2074 |
| | | | | | | 345/690 |
| 2011/0242065 | A1 | * | 10/2011 | Hsu | ...................... | G09G 3/3648 |
| | | | | | | 345/204 |

FOREIGN PATENT DOCUMENTS

| CN | 103984174 A | 8/2014 |
| KR | 10-2008-0078152 A | 8/2008 |
| KR | 10-2013-0133374 A | 12/2013 |

OTHER PUBLICATIONS

Chinese language office action dated Sep. 1, 2021, issued in application No. CN 201710357276.9.
(Continued)

*Primary Examiner* — Kevin M Nguyen
(74) *Attorney, Agent, or Firm* — McClure, Qualey & Rodack, LLP

(57) ABSTRACT

A display device includes a first gate line, a second gate line, a first data line and a second data line. The second gate line is disposed adjacent to the first gate line. The first gate line and the second gate line are disposed in parallel and extend in a first direction. The first data line and the second data line are disposed in parallel and extend in a second direction perpendicular to the first direction. There is no thin film transistor disposed adjacent to at least one of the following intersections: the intersection of the first gate line and the first data line; the intersection of the first gate line and the second data line; the intersection of the second gate line and the first data line; and the intersection of the second gate line and the second data line.

4 Claims, 9 Drawing Sheets

(52) U.S. Cl.
CPC ...... *H01L 27/124* (2013.01); *G02F 2201/121* (2013.01); *G09G 2300/0413* (2013.01); *G09G 2300/0426* (2013.01); *G09G 2310/0262* (2013.01); *G09G 2310/0264* (2013.01); *G09G 2320/0219* (2013.01); *G09G 2320/0233* (2013.01); *G09G 2320/0242* (2013.01); *G09G 2360/16* (2013.01)

(56) References Cited

OTHER PUBLICATIONS

Chinese language office action dated May 5, 2020, issued in application No. CN 201710357276.9.
Chinese language office action dated Jun. 9, 2021, issued in application No. CN 201710357276.9.

* cited by examiner

|  |  | Data line | | | |
|---|---|---|---|---|---|
|  |  | DA | DB | DC | DD |
| Gate line | 1 | Compensating | Charging | Compensating | Charging |
|  | 2 | Charging | Compensating | Charging | Compensating |
|  | 3 | Compensating | Charging | Charging | Compensating |
|  | 4 | Charging | Compensating | Compensating | Charging |
|  | 5 | Compensating | Charging | Compensating | Charging |
|  | 6 | Charging | Compensating | Charging | Compensating |
|  | 7 | Compensating | Charging | Charging | Compensating |
|  | 8 | Charging | Compensating | Compensating | Charging |

FIG. 6A

|  |  | Data line | | | |
|---|---|---|---|---|---|
|  |  | DA | DB | DC | DD |
| Gate line | 1 | Compensating | Charging | Compensating | Charging |
|  | 4 | Charging | Compensating | Compensating | Charging |
|  | 3 | Compensating | Charging | Charging | Compensating |
|  | 2 | Charging | Compensating | Charging | Compensating |
|  | 5 | Compensating | Charging | Compensating | Charging |
|  | 8 | Charging | Compensating | Compensating | Charging |
|  | 7 | Compensating | Charging | Charging | Compensating |
|  | 6 | Charging | Compensating | Charging | Compensating |

FIG. 6B

|  |  | Data line | | | |
|---|---|---|---|---|---|
|  |  | DA | DB | DC | DD |
| Gate line | 1 | Compensating | Charging | Compensating | Charging |
|  | 2 | Charging | Compensating | Charging | Compensating |
|  | 4 | Charging | Compensating | Compensating | Charging |
|  | 3 | Compensating | Charging | Charging | Compensating |
|  | 5 | Compensating | Charging | Compensating | Charging |
|  | 6 | Charging | Compensating | Charging | Compensating |
|  | 8 | Charging | Compensating | Compensating | Charging |
|  | 7 | Compensating | Charging | Charging | Compensating |

FIG. 6C

|  |  | Data line | | | |
|---|---|---|---|---|---|
|  |  | DA | DB | DC | DD |
| Gate line | 1 | Compensating | Charging | Compensating | Charging |
|  | 3 | Compensating | Charging | Charging | Compensating |
|  | 4 | Charging | Compensating | Compensating | Charging |
|  | 2 | Charging | Compensating | Charging | Compensating |
|  | 5 | Compensating | Charging | Compensating | Charging |
|  | 7 | Compensating | Charging | Charging | Compensating |
|  | 8 | Charging | Compensating | Compensating | Charging |
|  | 6 | Charging | Compensating | Charging | Compensating |

FIG. 6D

DISPLAY DEVICE

CROSS REFERENCE TO RELATED APPLICATIONS

This application is a Divisional of U.S. patent application Ser. No. 15/974,876, filed May 9, 2018, which claims priority of China Patent Application No. 201710357276.9, filed on May 19, 2017, the entirety of which is incorporated by reference herein.

BACKGROUND

Field of the Disclosure

The disclosure relates to a display device, and more particularly to a display device capable of reduced voltage shift in the common voltage.

Description of the Related Art

Poor circuit design can lead to color-shift problems in conventional liquid-crystal displays, OLED displays, and in recently developed AMLCDs, AMOLED displays, as well as in other types of displays.

In order to solve this color-shift problem, a novel design for the display device is required. By using a novel circuit configuration, voltage shift in the common voltage can be reduced.

BRIEF SUMMARY OF THE DISCLOSURE

An exemplary embodiment of a display device comprises a first gate line, a second gate line, a first data line and a second data line. The second gate line is disposed adjacent to the first gate line. The first gate line and the second gate line are disposed in parallel and extend in a first direction. The first data line and the second data line are disposed in parallel and extend in a second direction perpendicular to the first direction. There is no thin film transistor disposed adjacent to at least one of the following intersections: the intersection of the first gate line and the first data line; the intersection of the first gate line and the second data line; the intersection of the second gate line and the first data line; and the intersection of the second gate line and the second data line.

A detailed description is given in the following embodiments with reference to the accompanying drawings.

BRIEF DESCRIPTION OF DRAWINGS

The disclosure can be more fully understood by reading the subsequent detailed description and examples with references made to the accompanying drawings, wherein:

FIG. 6A is a diagram showing the exemplary charging and compensating relationship on each data line according to an embodiment of the disclosure;

FIG. 6B is a diagram showing the exemplary charging and compensating relationship on each data line according to another embodiment of the disclosure;

FIG. 6C is a diagram showing the exemplary charging and compensating relationship on each data line according to another embodiment of the disclosure;

FIG. 6D is a diagram showing the exemplary charging and compensating relationship on each data line according to another embodiment of the disclosure;

DETAILED DESCRIPTION OF THE DISCLOSURE

The following description is of the contemplated mode of carrying out the disclosure. This description is made for the purpose of illustrating the general principles of the disclosure and should not be taken in a limiting sense. The scope of the disclosure is determined by reference to the appended claims.

It will be also understood that when an element is referred to as being "coupled" to another element, it could be connected to another element directly or indirectly through at least one element.

Figure 1:
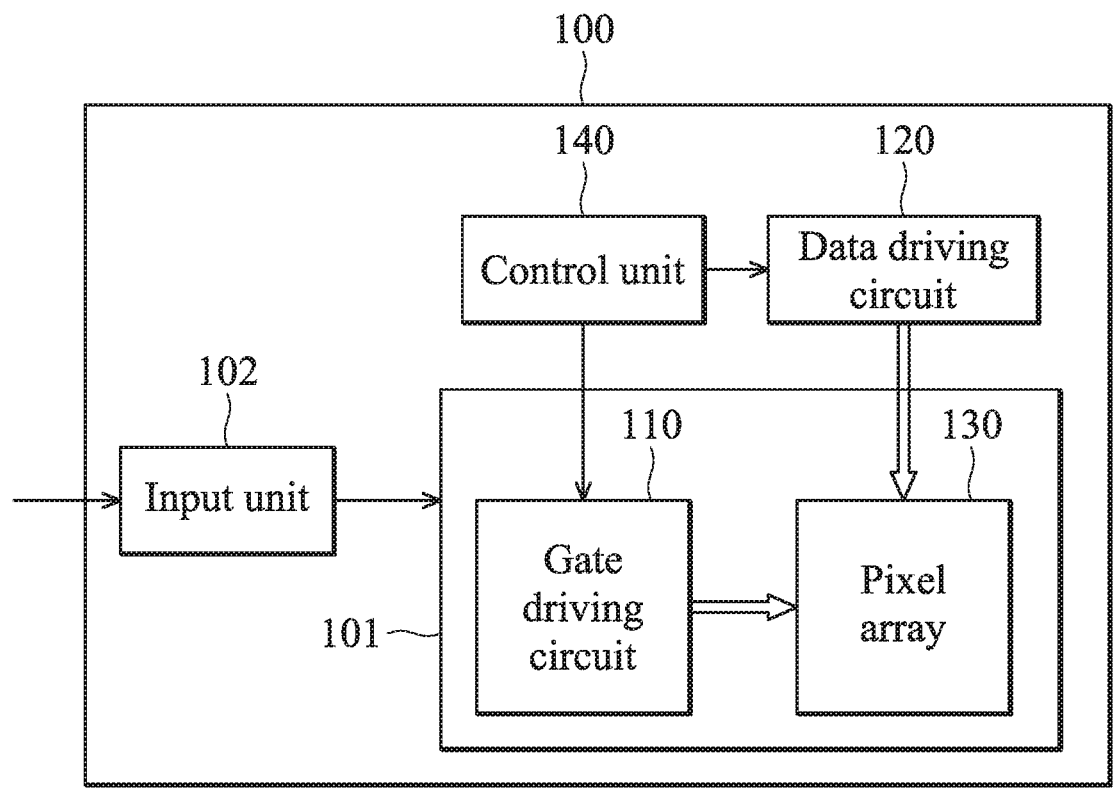
FIG. 1 is a block diagram of a display device according to an embodiment of the disclosure.

FIG. 1 is a block diagram of a display device according to an embodiment of the disclosure. As shown in FIG. 1, the display device 100 may comprise a display panel 101, a data driving circuit 120 and a control unit 140. The display panel 101 may comprise a gate driving circuit 110 and a pixel array 130. The gate driving circuit 110 generates a plurality of scan pulses (scanning enable pulses of gate signals) to gate lines to enable transistors coupled to gate lines for driving a plurality of pixels in the pixel array 130. The data driving circuit 120 generates a plurality of data signals to data lines to provide image data (voltage of gray level) to the pixels of the pixel array 130. The control unit 140 generates a plurality of timing signals, comprising clock signals, reset signals and start pulses for controlling the gate driving circuit 110 and the data driving circuit 120.

In addition, the display device 100 may further comprise an input unit 102. The input unit 102 receives image signals from image sources and controls the display panel 101 to display images. According to an embodiment of the disclosure, the display device 100 may be integrated in an electronic device. The electronic device may be implemented as various devices, comprising: a mobile phone, a digital camera, a personal digital assistant (PDA), a laptop computer, a personal computer, a television, an in-vehicle display, a portable DVD player, or any apparatus with image display functionality.

According to an embodiment of the disclosure, as shown in FIG. 1, the gate driving circuit 110 is disposed on the display panel 101 and outside of the pixel array 130, but the disclosure should not be limited thereto. Similarly, although in FIG. 1, the gate driving circuit 110 is disposed on the display panel 101, the disclosure should not be limited thereto. In other embodiments of the disclosure, the gate driving circuit 110 may also be not disposed on the display panel 101, and may be disposed outside of the display panel 101 as the data driving circuit 120. Via the chip on film (COF) technology, a plurality of scan pulses may be provided to the display panel 101.

According to an embodiment of the disclosure, the pixel array 130 may comprise a plurality of pixel units. At least one thin film transistor (TFT) of each pixel units is coupled to related gate line and data line.

Figure 2:
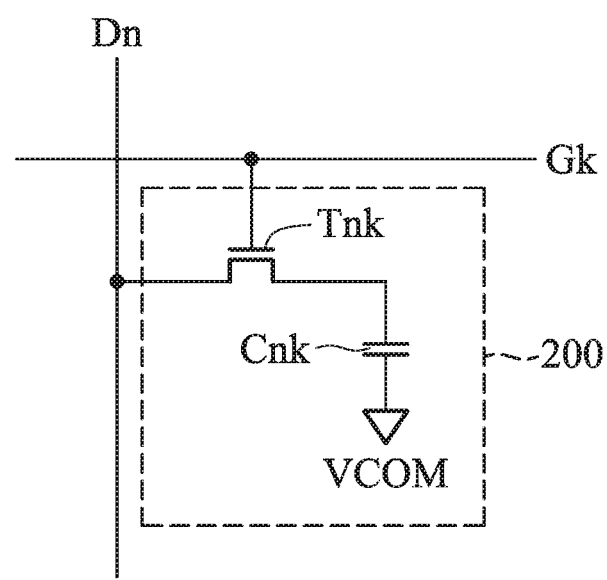
FIG. 2 shows an exemplary circuit diagram of a pixel unit according to an embodiment of the disclosure.

FIG. 2 shows an exemplary circuit diagram of a pixel unit according to an embodiment of the disclosure. According to an embodiment of the disclosure, the pixel unit 200 shown in FIG. 2 may be one of the pixel units in the pixel array 130. The TFT Tnk of the pixel unit 200 may be coupled to the n-th data line Dn and the k-th gate line Gk of the display panel 101, where n and k are positive integers. The pixel unit 200 may comprise a liquid-crystal capacitor Cnk coupled to the common voltage VCOM.

For a color display, the pixel unit may correspond to a single sub-pixel, such as a red (R) sub-pixel, blue (B) sub-pixel, green (G) sub-pixel, white (W) sub-pixel, or yellow (Y) sub-pixel. The pixel unit may correspond to a set of multi sub-pixels, such as a set of the RGB sub-pixels, a set of the RGBW sub-pixels, a set of the RGBY sub-pixels, a set of the RB sub-pixels, a set of the RG sub-pixels, or a set of the GB sub-pixels.

Figure 3:
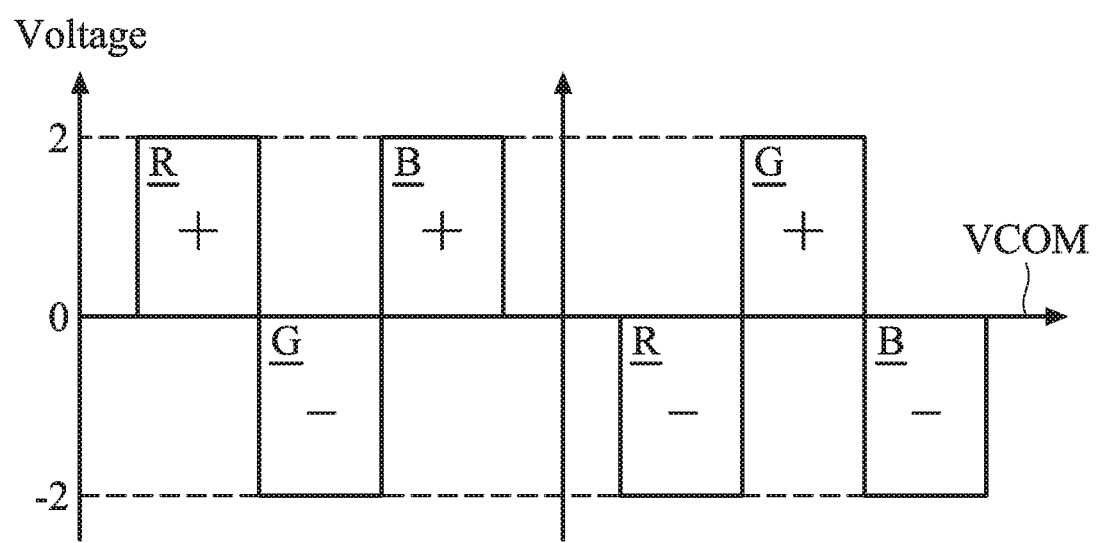
FIG. 3 shows the charge/discharge voltage and voltage polarity corresponding to a set of the RGB sub-pixels.

FIG. 3 shows the charge/discharge voltage and voltage polarity corresponding to a set of the RGB sub-pixels, wherein the '+' sign represents that the voltage provided to the corresponding sub-pixel with respect to the common voltage VCOM is positive polarity, and the '−' sign represents that the voltage provided to the corresponding sub-pixel with respect to the common voltage VCOM is negative polarity. In general, the control unit 140 determines a voltage and a voltage polarity for charging/discharging each pixel unit according to the image data, and supplies the charge/discharge voltage to the data lines corresponding to (that is, coupled to) the pixel units. However, since there is capacitance between the data line and the common electrode for providing the common voltage VCOM, the voltage change on the data line will cause the level of the common voltage VCOM to be shifted.

When the voltage shift in the common voltage VCOM has occurred, the voltage differences between the common voltage VCOM and the voltage provided to liquid-crystal capacitors of each pixel units will change, accordingly. Therefore, the color and brightness displayed on the display panel may be off, resulting in the crosstalk phenomenon.

Figure 4A:
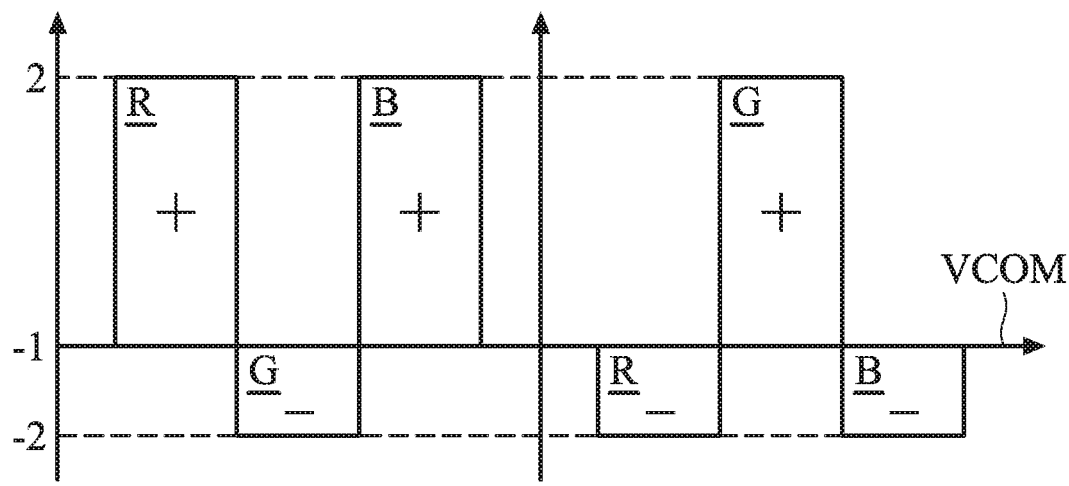
FIG. 4A is an exemplary diagram showing the shift toward negative of the common voltage VCOM.
Figure 4B:
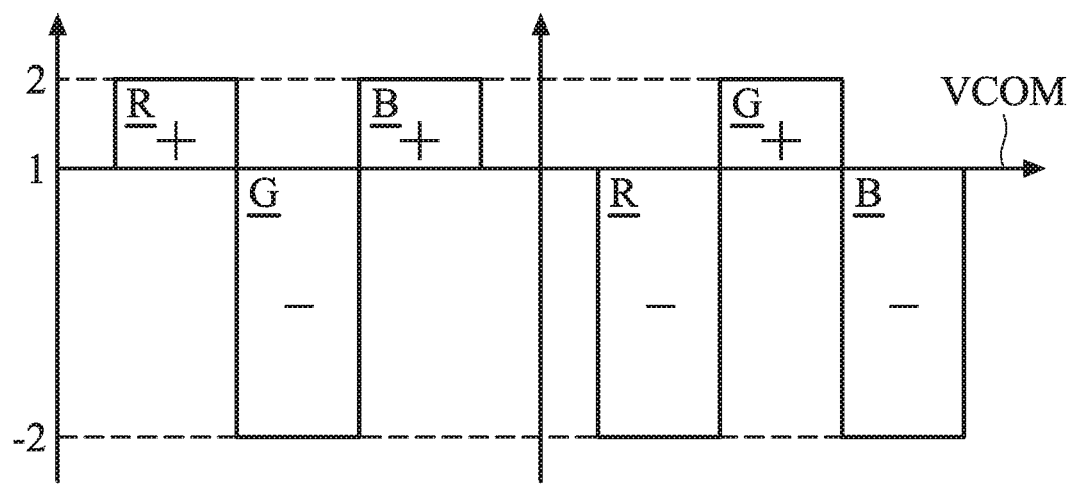
FIG. 4B is an exemplary diagram showing the shift toward positive of the common voltage VCOM.

FIG. 4A is an exemplary diagram showing a negative shift of the voltage level of the common voltage VCOM. FIG. 4B is an exemplary diagram showing a positive shift of the voltage level of the common voltage VCOM. As shown in the figures, the voltage difference between the common voltage VCOM and each pixel units is changed due to the voltage shift of the common voltage VCOM, resulting in the displayed color of the pixel being different from expectations.

To solve the crosstalk problem caused by voltage shift in the common voltage VCOM, a novel pixel unit layout and a driving method for a display panel will be discussed in the follow paragraphs.

Figure 5A:
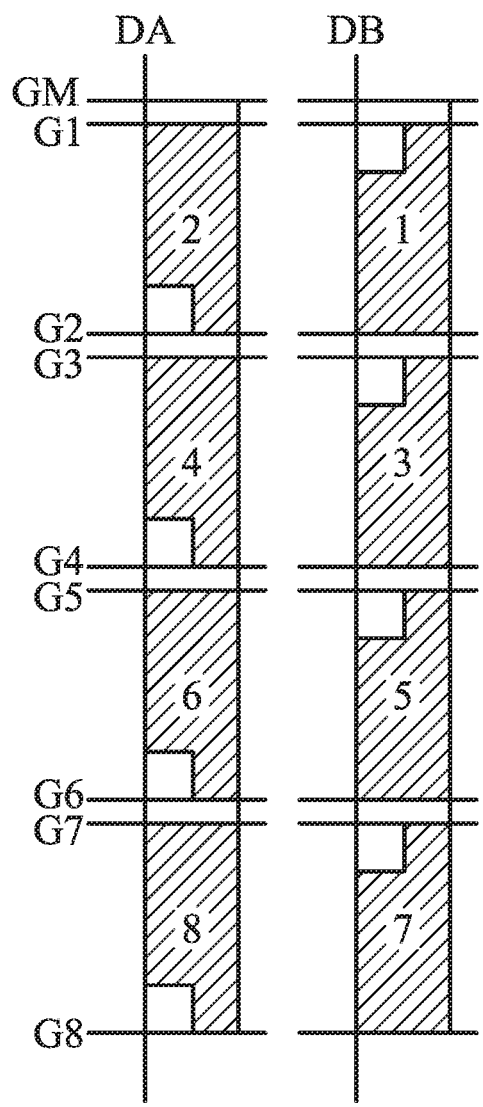
FIG. 5A shows a first exemplary pixel layout according to an embodiment of the disclosure.

According to an embodiment of the disclosure, there are two gate lines disposed between adjacent two pixel units (e.g., pixel units 1 and 3 in FIG. 5A). Therefore, in an embodiment of the disclosure, the number of gate lines (except dummy gate line GM) in the display panel may be greater than or equal to twice of the number of pixel units coupled to one data line. The number of gate lines (except dummy gate line GM) may be greater than or equal to twice of the number of pixel units in a column. In addition, according to an embodiment of the disclosure, not all of the intersections of the data lines and the gate lines will be couple to a TFT. For at least one intersection of a gate line and a data line, there is no TFT disposed adjacent thereto (that is, at least one intersection of a gate line and a data line is configured without a TFT disposed adjacent to it).

FIG. 5A shows a first exemplary pixel layout according to an embodiment of the disclosure. As shown in FIG. 5A, the reference numbers 1-8 denote pixel units, for example, the pixel unit 200 shown in FIG. 2, wherein the pixel unit comprises at least a TFT (shown by the blank block in each pixel unit in FIG. 5A and adjacent to intersection of gate line and data line). In addition, the area filled with slashes in the figure represents the aperture area of the pixel unit.

The gate lines G2 and G3 are disposed between the pixel units 1 and 3, and between the pixel units 2 and 4. The gate lines G4 and G5 are disposed between the pixel units 3 and 5, and between the pixel units 4 and 6. The gate lines G6 and G7 are disposed between the pixel units 5 and 7, and between the pixel units 6 and 8. The data line DA could be adjacent to or not adjacent to the data line DB.

In addition, as shown in FIG. 5A, there are TFTs (the blank block in each pixel units) disposed adjacent to a portion of the intersections of the data lines and the gate lines, where the TFTs of pixel units are coupled to the corresponding gate lines and data lines, and there is no TFT disposed adjacent to another portion of the intersections of the data lines and the gate lines. As an example, no TFT of the pixel unit 2 is disposed adjacent to the intersection of the gate line G1 and the data line DA. The operation of charging or discharging the pixel unit 2 is performed via the TFT connected to the gate line G2 and the data line DA. Therefore, the TFT of the pixel unit 2 is disposed adjacent to the intersection of the gate line G2 and the data line DA, not disposed adjacent to the intersection of the gate line G1 and the data line DA. As another example, no TFT connected to the pixel unit 1 is disposed adjacent to the intersection of the gate line G2 and the data line DB. The operation of charging or discharging the pixel unit 1 is performed via the TFT connected to the gate line G1 and the data line DB. Therefore, the TFT of the pixel unit 1 is disposed adjacent to the intersection of the gate line G1 and the data line DB, not disposed adjacent to the intersection of the gate line G2 and the data line DB. The same TFT configuration rule is applied to the remaining pixel units.

In addition, according to an embodiment of the disclosure, a vertical distance (minimum distance) between the gate line G1 and the gate line G2 is greater than a vertical distance (minimum distance) between the gate line G2 and the gate line G3, and so on.

Figure 5B:
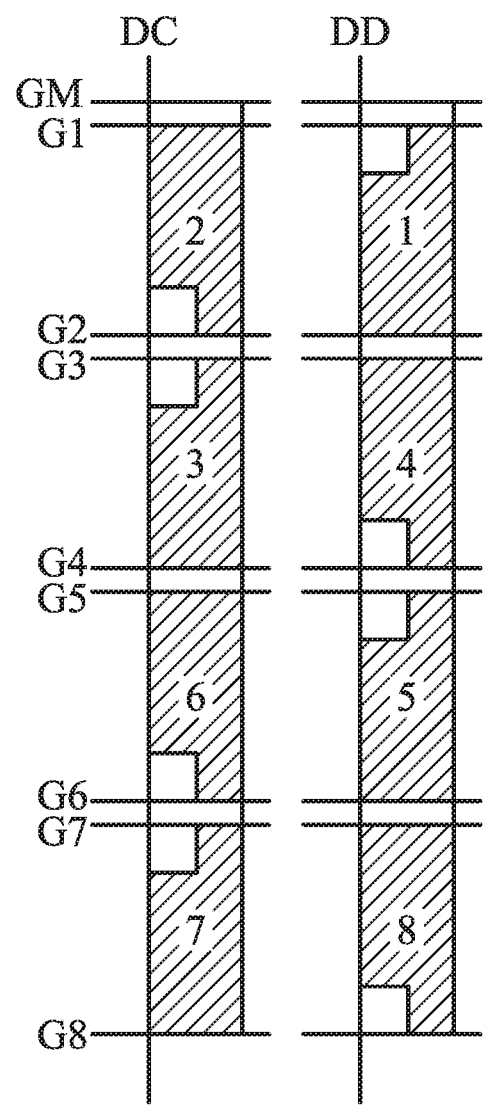
FIG. 5B shows a second exemplary pixel layout according to another embodiment of the disclosure.

FIG. 5B shows a second exemplary pixel layout according to another embodiment of the disclosure. As shown in FIG. 5B, gate lines G2 and G3 are disposed between the pixel units 1 and 4, and between pixel units 2 and 3. Gate lines G4 and G5 are disposed between pixel units 4 and 5, and between pixel units 3 and 6. Gate lines G6 and G7 are disposed between pixel units 5 and 8, and between pixel units 6 and 7. The data line DC could be adjacent to or not adjacent to the data line DD.

In addition, as shown in FIG. 5B, there are TFTs (shown by the blank block in each pixel unit) disposed adjacent to and be coupled to some of the intersections of the data lines and the gate lines, where the TFTs of the pixel units are coupled to the corresponding gate lines and data lines, and there is no TFT disposed adjacent to some of the intersections of the data lines and the gate lines. As an example, no TFT connected to the pixel unit 4 is disposed adjacent to the intersection of the gate line G3 and the data line DD. The operation of charging or discharging the pixel unit 4 is performed via the TFT connected to the gate line G4 and the data line DD. Therefore, the TFT of the pixel unit 4 is disposed adjacent to the intersection of the gate line G4 and the data line DD, not disposed adjacent to the intersection of the gate line G3 and the data line DD. As another example, no TFT connected of the pixel unit 3 is disposed adjacent to the intersection of the gate line G4 and the data line DC. The operation of charging or discharging the pixel unit 3 is performed via the TFT connected to the gate line G3 and the data line DC. Therefore, the TFT of the pixel unit 3 is disposed adjacent to the intersection of the gate line G3 and the data line DC, not disposed adjacent to the intersection of the gate line G4 and the data line DC. The same TFT configuration rule is applied to the remaining pixel units.

In addition, according to an embodiment of the disclosure, the vertical distance (minimum distance) between the gate line G1 and the gate line G2 is greater than the vertical distance (minimum distance) between the gate line G2 and the gate line G3, and so on.

According to an embodiment of the disclosure, the display panel 101 could comprise the configurations of the TFTs corresponding to the data line DA and the configurations of the TFTs corresponding to the data line DB for compensating for the impact on the common voltage VCOM due to the voltage shift on the data lines. Similarly, the display panel 101 could comprise configurations of the TFTs corresponding to the data line DC and the configurations of the TFTs corresponding to the data line DD for compensating for the impact on the common voltage VCOM due to the voltage shift on the data lines. It should be noted that the TFTs corresponding to the data line DA are not limited to being adjacent to the TFTs corresponding to the data line DB. The TFTs disposed corresponding to the data line DC are not limited to being adjacent to the TFTs disposed corresponding to the data line DD.

As discussed above, when voltage shift has occurred on the data line, the level of the common voltage VCOM may be shifted. Therefore, in the embodiment of the disclosure, via the proposed TFTs configurations on at least two data lines and the corresponding pixel units, the voltage shift on one data line can be compensated for by the voltage shift on another data line, thereby the voltage variations on the common voltage VCOM causing the voltage being shifted in opposite directions will be cancelled or reduced.

Note that in the actual layout or configuration, there is no limitation on the number, order and placement of the data lines DA and DB, as well as the data lines DC and DD. For example, when the display panel needs P data lines, the TFTs and the pixel units corresponding to m data lines can be implemented as the exemplary data line DA (or the exemplary data line DC) shown in the FIG. 5A (or FIG. 5B), and the TFTs and the pixel units corresponding to the remaining n data lines can be implemented as the exemplary data line DB (or the exemplary data line DD) shown in FIG. 5A (or FIG. 5B), where both m and n may be less than (P/2), or preferably m=n=(P/2). In this manner, the common voltage VCOM can be pulled more evenly in opposite directions and the voltage shifts in opposite directions can be balanced.

In addition, the data lines DA and DB, and the data lines DC and DD are not limited to being arranged or disposed in adjacent positions. To be more specifically, the exemplary data lines DA and DB (or the exemplary data lines DC and DD) may be arranged or configured adjacent to each other, or, there may be at least one data line other than the data lines DA and DB disposed between the exemplary data line DA and DB (or the exemplary data lines DC and DD). In addition, the layout of the pixel units and the configuration of TFTs corresponding to data lines of a display panel may adopt both the layout and the configuration on the exemplary data lines DA, DB, DC and DD (as shown in FIG. 6A-FIG. 6D), or may adopt only the layout and the configuration on the exemplary data lines DA and DB (as shown in FIG. 5A), or may adopt only the layout and the configuration on the exemplary data lines DC and DD (as shown in FIG. 5B).

In addition, the TFT configurations corresponding to the exemplary data lines DA, DB, DC, and DD and the corresponding pixel units are not limited to being disposed at any specific position of the display panel. For example, on the left half of the data lines of the display panel, the layout and the configuration on the exemplary data lines DA and DB may be adopted, while on the right half of the data lines of the display panel, the layout and the configuration on the exemplary data lines DC and DD may be adopted, or there may be any other modification.

FIG. 6A is a diagram showing the exemplary charging and compensating relationship on each data line according to an embodiment of the disclosure. In FIG. 6A, only 32 pixel units are schematically depicted, and the data lines DA, DB, DC and DD are sequentially disposed. The configurations of the TFT of the pixel units corresponding to the exemplary data lines DA and DB may refer to the embodiment shown in FIG. 5A, and the configurations of the TFT of the pixel units corresponding to the exemplary data lines DC and DD may refer to the embodiment shown in FIG. 5B. According to an embodiment of the disclosure, "the period of time when a voltage is provided to a data line for charging or discharging the corresponding pixel unit" is regarded as a "charging period", and "the period of time when a voltage is provided to a data line but not for charging or discharging the corresponding pixel unit" is regarded as a "compensating period".

In FIG. 6A, the word "charging" means that the data line is provided with a voltage for charging the corresponding pixel unit, and the word "compensating" means that the data line is provided with a voltage for compensating for the voltage shift on the common electrode (so as to decrease the voltage shift on the common electrode caused by the voltage change on the corresponding data line), not provided for charging the corresponding pixel unit. The relationship between the charging and compensating operations on the data lines is clearly shown in FIG. 6A. In the layout of the pixel units on the exemplary data lines DA and DB, the 2N-th gate line (where N is a positive integer and greater than 0) and the exemplary data line DA are electrically connected to a pixel unit (that is, there is a TFT disposed adjacent to the intersection of the 2N-th gate line and the exemplary data line DA), and the (2N−1)-th gate line and the exemplary data line DB are electrically connected to a pixel unit (that is, there is a TFT disposed adjacent to the intersection of the (2N−1)-th gate line and the exemplary data line DB). When a scan pulse is provided to the 2N-th gate line, a voltage is provided to the exemplary data line DA for charging/discharging the corresponding pixel unit. Meanwhile, another voltage is provided to the exemplary data line DB to cause another voltage change in a reverse direction as compared to the voltage change on the exemplary data line DA, so as to compensate for the voltage shift on the common electrode caused by the voltage change on the exemplary data line DA. It should be understood that "in the reverse direction" here does not means that the voltage polarities on the exemplary data lines DA and DB are different. For example, suppose that when the voltage on the exemplary data line DA is to be changed from the original voltage (the first predefined voltage) +3V to a first voltage +5V, the voltage shift is +2V, which will cause the voltage on the common electrode to be shifted in a positive direction. If the original voltage (the second predefined voltage) on the exemplary data line DB is +3V, in order to cancel out the effect of the voltage shift on the common electrode caused by the voltage change on the exemplary data line DA, the voltage shift to be generated on the exemplary data line DB is (−2V). Therefore, the voltage to be provided on the exemplary data line DB will be +3V+(−2V)=+1V. Note that at the time, both the voltage polarities on the exemplary data lines DA and DB are positive, but the voltages on the exemplary data lines DA and DB are changed in opposite directions.

Similarly, when a scan pulse is provided to the (2N−1)-th gate line, a voltage is provided to the exemplary data line DB for charging/discharging the corresponding pixel unit, and another voltage is provided to the exemplary data line DA to generate another voltage change in a reverse direction, so as to compensate for the voltage shift on the common electrode caused by the voltage change on the exemplary data line DB.

FIG. 6B, FIG. 6C and FIG. 6D are the diagrams showing the exemplary charging and compensating relationships on each data line according to other embodiments of the disclosure. Different from the embodiment shown in FIG. 6A, in FIG. 6B, FIG. 6C and FIG. 6D, the order of turning on the gate lines may be flexibly adjusted based on different requirements, and the voltage compensation operations on the data lines will not be affected. As shown in FIG. 6A-FIG. 6D, every time when one gate line is turned on (that is, the scan pulse is provided) and the corresponding pixel unit is charged, the voltage compensation operation is performed on at least one pixel unit in the same row, so as to generate another voltage change in an opposite direction. During the period of time when the gate line is turned on, the pixel unit on which the voltage compensation operation is performed will not be charged.

Figure 7:
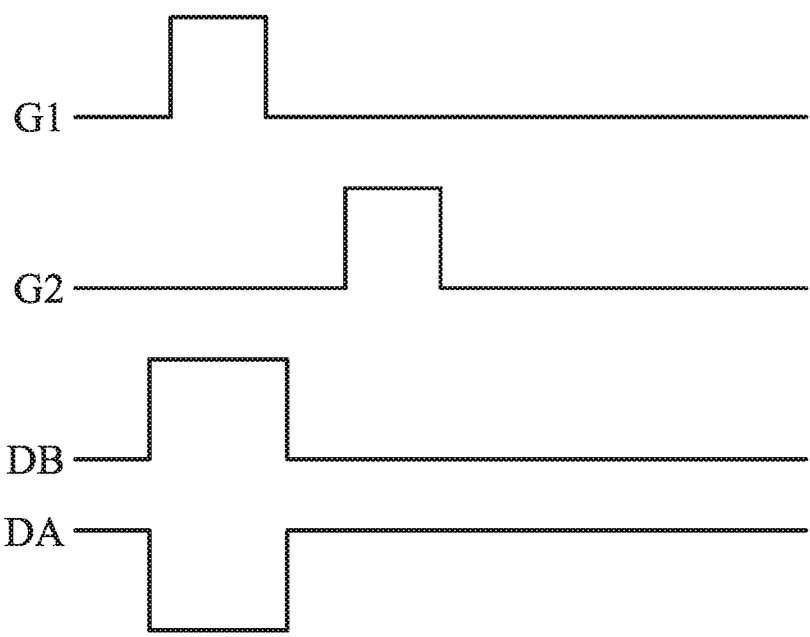
FIG. 7 shows the exemplary timing diagram of the driving signals according to an embodiment of the disclosure.

FIG. 7 shows the exemplary timing diagram of the driving signals according to an embodiment of the disclosure. According to an embodiment of the disclosure, when a scan pulse is provided to the gate line G1, a first voltage is provided to the first data line (for example, the exemplary data line DB) and a second voltage is provided to the second data line (for example, the exemplary data line DA). According to an embodiment of the disclosure, the second voltage is determined according to the first voltage. To be more specific, according to an embodiment of the disclosure, when a voltage on the first data line is changed from a first predefined voltage to a first voltage and thereby generating a first voltage shift, a voltage on the second data line is changed from a second predefined voltage to a second voltage, so as to generating a second voltage shift. One of the first voltage shift and the second voltage shift is greater than zero, and the other of the two is less than zero. In this manner, the voltage shift on the common voltage VCOM caused by the voltage change on the first data line can be compensated for via the voltage change on the second data line. The result of voltage shift compensation in the common voltage VCOM can be achieved.

For example, suppose that there is a TFT disposed adjacent to the intersection of the gate line G1 and the data line DB as shown in FIG. 5A and there is no TFT disposed adjacent to the intersection of the gate line G1 and the data line DA, "the period of time when a voltage is provided to the data line DB for charging or discharging the corresponding pixel unit" is regarded as a "charging period", and "the period of time when a voltage is provided to the data line DA for compensating for the voltage shift on the common electrode caused by the voltage change on the data line DB, not for charging or discharging the corresponding pixel unit" is regarded as a "compensating period". According to an embodiment of the disclosure, via the proposed layout of the pixel units as discussed above, a data signal is provided to the data line DA in the compensating period which is not utilized for charging the corresponding pixel unit, and during the compensating period, a compensation voltage is provided, so as to compensate for the voltage shift on the common electrode caused by the voltage change on the data line DB.

According to an embodiment of the disclosure, the compensating period and the corresponding charging period may be overlapped, and the voltage compensation is preferably performed before the charging of the corresponding pixel unit is finished.

In the following paragraph, a method for determining the compensation voltage will be provided. Suppose that the current voltage on the data line DB is V1 (the first predefined voltage), and the current voltage on the data line DA is V2 (the second predefined voltage). If the voltage on the data line DB will be set to V3 (the first voltage) during the next charging period, and the voltage shift (the first voltage shift) to be generated on the data line DB will be (V3−V1). In order to compensate for the voltage shift on the common electrode caused by the voltage change on the data line DB, the voltage on the data line DA can be set to V4 (the second voltage) during the corresponding compensating period, where V4=V2+[−(V3−V1)].

Figure 8:
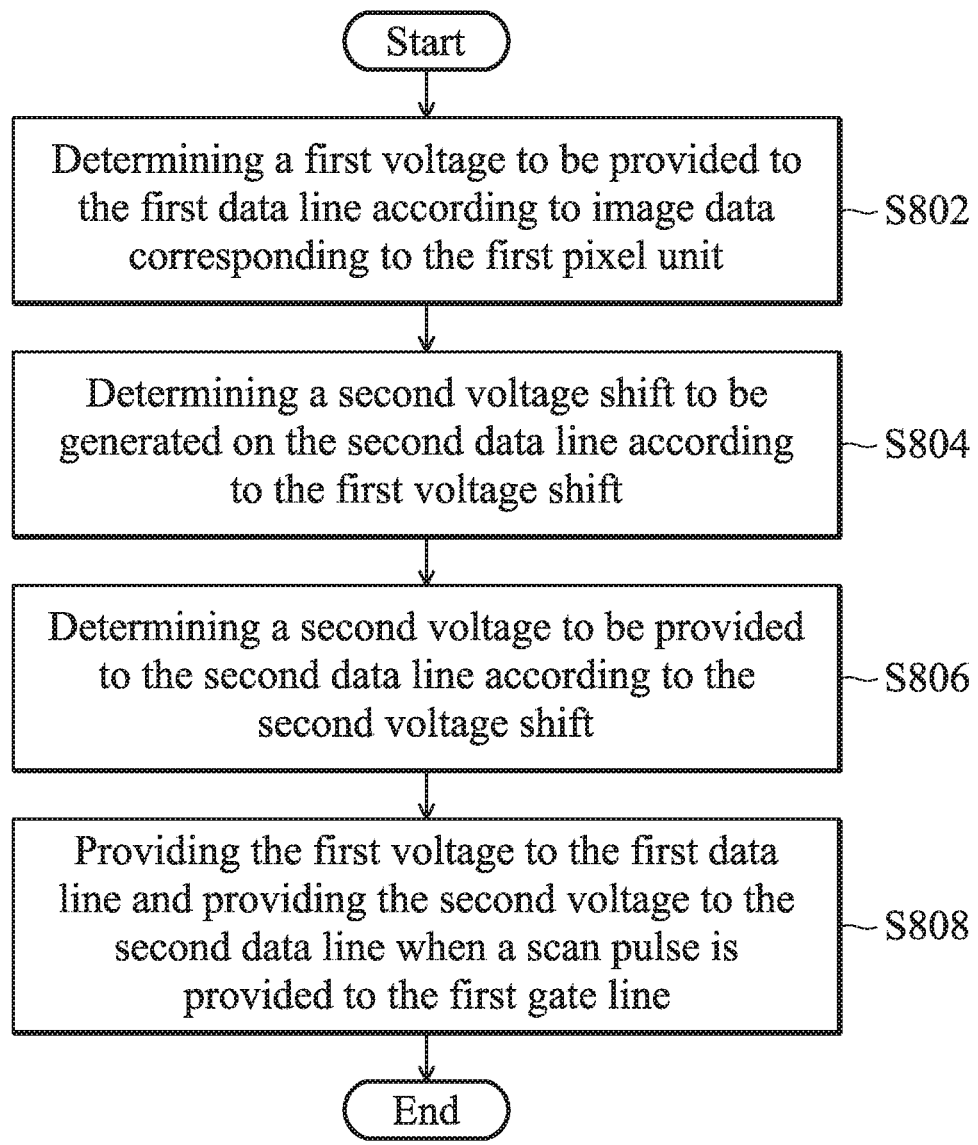
FIG. 8 is a flow chart showing a method for driving a display panel according to an embodiment of the disclosure.

FIG. 8 is a flow chart showing a method for driving a display panel according to an embodiment of the disclosure. The display panel may comprise a first pixel unit (for example, pixel unit 1), a first data line (for example, the data line DB), a second data line (for example, the data line DA), a first gate line (for example, the gate line G1). A first TFT of the first pixel unit is coupled to the first data line DA and the first gate line. First of all, during a first period of time, a first voltage to be provided to the first data line is determined according to image data corresponding to the first pixel unit (Step S802). A first voltage shift will be generated on the first data line when the first voltage is provided.

For example, as discussed above, suppose that the current voltage on the data line DB is V1 and the current voltage on the data line DA is V2. The control unit may determine the voltage to be provided to the data line DB in the next charging period according to the image data corresponding to the first pixel unit in the next frame. Suppose that the data line DB will be charged to the voltage V3, the first voltage shift to be generated on the data line DB will be (V3−V1).

Next, a second voltage shift to be generated on the second data line (for example, the data line DA) is determined according to the first voltage shift (step S804). For example, the second voltage shift to be generated on the second data line will be −(V3−V1).

Next, a second voltage to be provided to the second data line is determined according to the second voltage shift (step S806). For example, in order to compensate for the voltage shift to be generated on the data line DB, the voltage on the data line DA will be set to V4=V2+[−(V3−V1)] in the corresponding compensating period.

Finally, when a scan pulse is provided to the first gate line, the first voltage is provided to the first data line and the second voltage is provided to the second data line (Step S808). It should be noted that the first voltage is provided to charge the first pixel unit, and since there is no TFT disposed between the intersection of the first gate line and the second data line for a second pixel unit, the second voltage is not provided to charge the second pixel unit.

According to an embodiment of the disclosure, either the first voltage shift or the second voltage shift is greater than zero, and the other of the two is less than zero. Preferably, the first voltage shift is substantial equal to the second voltage shift or the absolute value of the first voltage shift and the absolute value of the second voltage shift are substantially the same. As discussed above, (V4−V2)=−(V3−V1).

According to an embodiment of the disclosure, the display panel may further comprise a second pixel unit (for example, the pixel unit 2) coupled to the second gate line (for example, the gate line G2) and the second data line (for example, the data line DA) via a second TFT. The flow chart of the method as shown in FIG. 8 may further comprise the following steps: during a second period of time, determining a third voltage to be provided to the second data line (for example, the data line DA) according to the image data corresponding to the second pixel unit, wherein a third voltage shift will be generated on the second data line when the third voltage is provided; determining a fourth voltage shift to be generated on the first data line (for example, the data line DB) according to the third voltage shift; determining a fourth voltage to be provided to the first data line according to the fourth voltage shift; and when a second scan pulse is provided to the second gate line (for example, the gate line G2), providing the fourth voltage to the first data line (for example, the data line DB) and providing the third voltage to the second data line (for example, the data line DA).

It should be noted that it is preferred for the data lines in the display panel that generate a voltage shift in the charging period to have one or more corresponding data lines for voltage shift compensation, but the disclosure is not limited thereto. In addition, in the embodiment of the disclosure, although in step S808, the second voltage is provided to the second data line to compensate for the voltage change on the first data line, it is not limited to use the first data line to compensate for the voltage change on the second data line in the second period of time. In other words, in the embodiments of the disclosure, the compensation for the voltage variation can be performed by using any data line that can provide a compensation period in the corresponding data signal.

As discussed above, in the embodiments of the disclosure, via the proposed layout of the pixel units, there is no TFT disposed adjacent to a portion of the intersections of the data lines and the gate lines. In this manner, the compensating period which is not utilized for charging the pixel unit will be created in the data signal of specific data line(s). And during the compensating period, a compensation voltage is provided, so as to compensate for the voltage shift on the common electrode caused by the voltage change on the other data line(s). Since the voltage shift on one data line can be compensated for by the voltage shift on another data line, the voltage shift in the common voltage VCOM can be avoided, and the crosstalk distortion on the display screen will be improved.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the disclosure has been described by way of example and in terms of several embodiments, it is to be understood that the disclosure is not limited thereto. Those who are skilled in this technology can still make various alterations and modifications without departing from the scope and spirit of this disclosure. Therefore, the scope of the present disclosure shall be defined and protected by the following claims and their equivalents.

What is claimed is:
1. A display device, comprising:
a first gate line and a second gate line, adjacent to each other and extending in a first direction;
a third gate line and a fourth gate line, adjacent to each other and extending in the first direction, wherein the second gate line is disposed between the third gate line and the first gate line, and the third gate line is disposed between the second gate line and the fourth gate line;
a first data line and a second data line, adjacent to each other and extending in a second direction perpendicular to the first direction;
a third data line and a fourth data line, adjacent to each other and extending in the second direction, wherein the fourth data line is disposed between the third data line and the first data line, and the first data line is disposed between the second data line and the fourth data line;
a first thin film transistor, coupled to the first gate line and the first data line;
a second thin film transistor, coupled to the second gate line and the second data line;
a third thin film transistor, coupled to the third gate line and the first data line;
a fourth thin film transistor, coupled to the fourth gate line and the second data line;
a fifth thin film transistor, coupled to the first gate line and the third data line;
a sixth thin film transistor, coupled to the second gate line and the fourth data line;
a seventh thin film transistor, coupled to the third gate line and the fourth data line; and
an eighth thin film transistor, coupled to the fourth gate line and the third data line;
wherein there is no thin film transistor coupled to the first gate line and the second data line, the second gate line and the first data line, the third gate line and the second data line, the fourth gate line and the first data line, the first gate line and the fourth data line, the second gate line and the third data line, the third gate line and the third data line, and the fourth data line and the fourth data line.

2. The display device as claimed in claim 1, wherein during a first period of time, when a scan pulse is provided to the first gate line, a voltage of the first data line is changed from a first predefined voltage to a first voltage and generates a first voltage shift, a voltage of the second data line is changed from a second predefined voltage to a second voltage and generates a second voltage shift, one of the first voltage shift and the second voltage shift is greater than zero, and the other of the first voltage shift and the second voltage shift is less than zero.

3. The display device as claimed in claim 2, wherein the first voltage shift is substantial equal to the second voltage shift.

4. The display device as claimed in claim 1, wherein the first data line is adjacent to the second data line.

\* \* \* \* \*